(12) United States Patent
Chen et al.

(10) Patent No.: US 6,979,869 B2
(45) Date of Patent: Dec. 27, 2005

(54) SUBSTRATE-BIASED I/O AND POWER ESD PROTECTION CIRCUITS IN DEEP-SUBMICRON TWIN-WELL PROCESS

(75) Inventors: Jau-Wen Chen, Cupertino, CA (US); Yoon Huh, San Jose, CA (US); Peter Bendix, Redwood City, CA (US)

(73) Assignee: LSI Logic Corporation, Milpitas, CA (US)

( * ) Notice: Subject to any disclaimer, the term of this patent is extended or adjusted under 35 U.S.C. 154(b) by 113 days.

(21) Appl. No.: 10/676,602

(22) Filed: Oct. 1, 2003

(65) Prior Publication Data

US 2005/0082621 A1 Apr. 21, 2005

(51) Int. Cl.⁷ ............................................. H01L 23/62
(52) U.S. Cl. ................. 257/356; 257/360; 257/365; 257/371; 257/401; 257/546
(58) Field of Search ................. 257/355, 356, 257/360, 365, 371, 401, 546

(56) References Cited

U.S. PATENT DOCUMENTS

| | | | |
|---|---|---|---|
| 6,329,694 B1 * | 12/2001 | Lee et al. | 257/372 |
| 6,469,354 B1 * | 10/2002 | Hirata | 257/358 |
| RE38,222 E * | 8/2003 | Wu | 257/356 |
| 6,750,517 B1 * | 6/2004 | Ker et al. | 257/401 |
| 6,788,507 B2 * | 9/2004 | Chen et al. | 361/56 |
| 6,858,902 B1 * | 2/2005 | Salling et al. | 257/360 |

OTHER PUBLICATIONS

"ESD in Silicon Integrated Circuits", Design Concepts, Chapter 4, Section 2, p 69-71, pre-2003.
Duvvury, C., "ESD On-Chip Protection in Advanced Technologies", 1999 ESD tutorial, Orlando, Florida, Sep. 26, 1999.
Duvvury, C et al., "Advanced CMOS Protection Device Trigger Mechanisms During CDM", EOS/ESD Symposium, 1995.

* cited by examiner

Primary Examiner—Tom Thomas
Assistant Examiner—Matthew E. Warren
(74) Attorney, Agent, or Firm—Trexler, Bushnell, Giangiorgi, Blackstone & Marr, Ltd.

(57) ABSTRACT

A semiconductor device which includes a P-well which is underneath NMOS fingers. The device includes an N-well ring which is configured so that the inner P-well underneath the NMOS fingers is separated from an outer P-well. The inner P-well and outer P-well are connected by a P-substrate resistance which is much higher than the resistance of the P-wells. A P+-diffusion ring surrounding the N-well ring is configured to connect to VSS, i.e., P-taps.

18 Claims, 6 Drawing Sheets

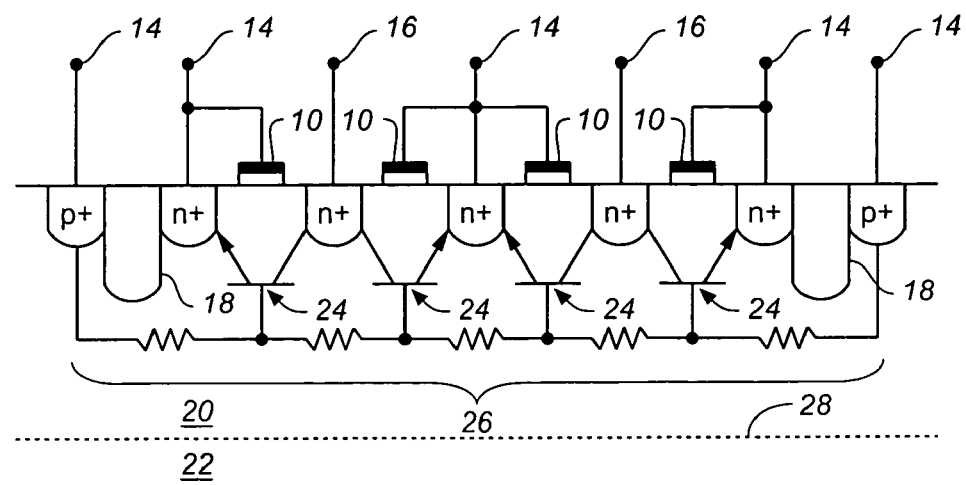
FIG._1
*(PRIOR ART)*
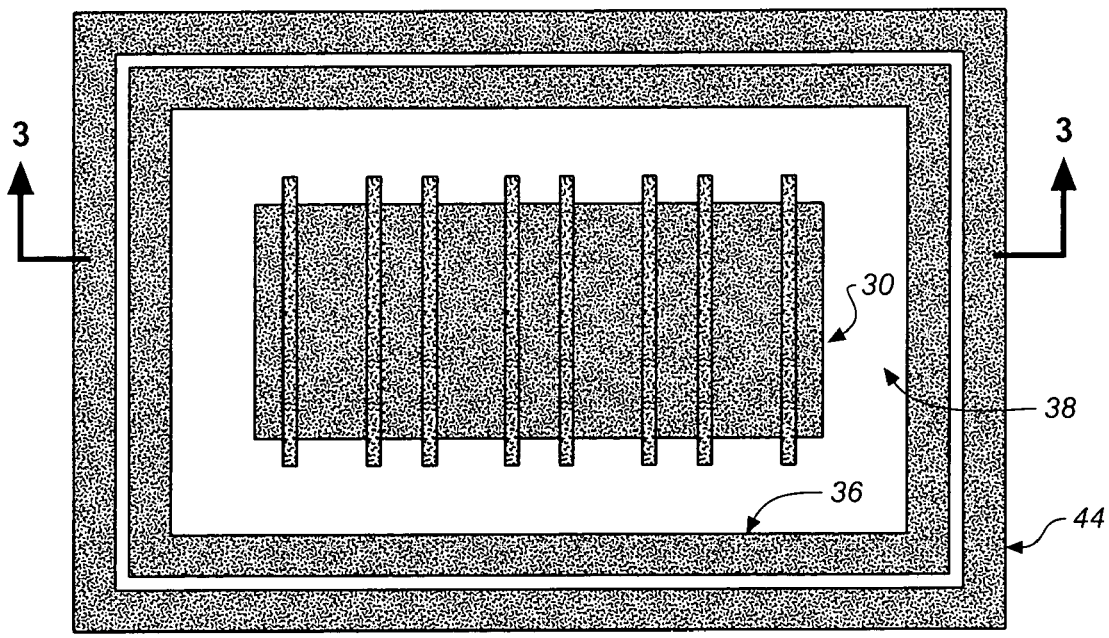
FIG._2

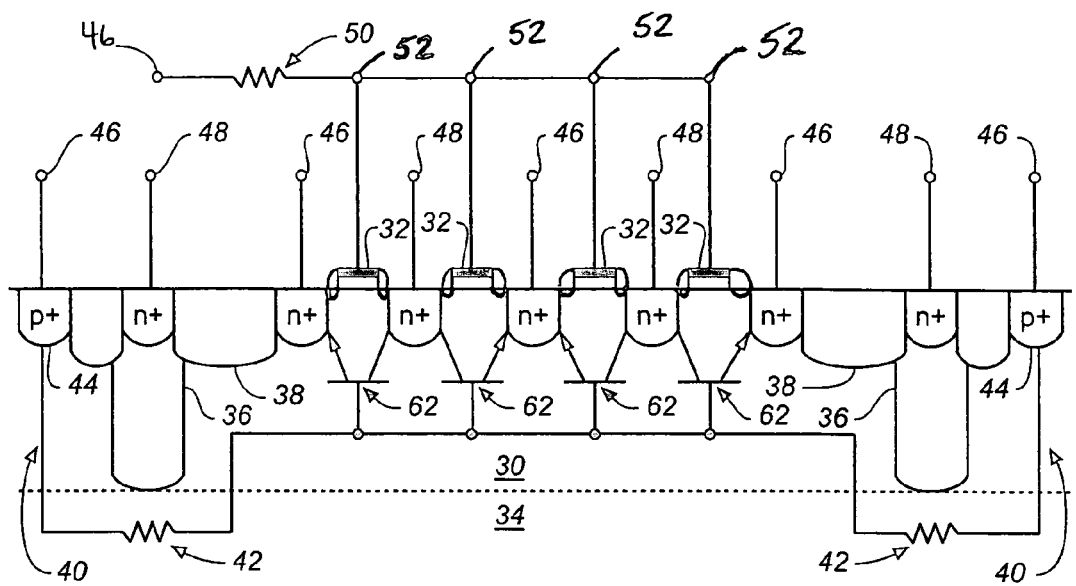
FIG._3
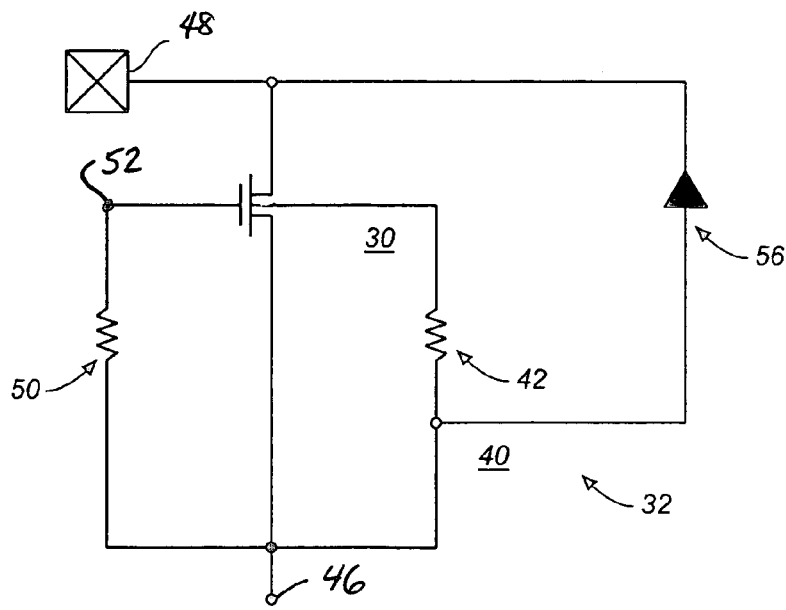
FIG._4

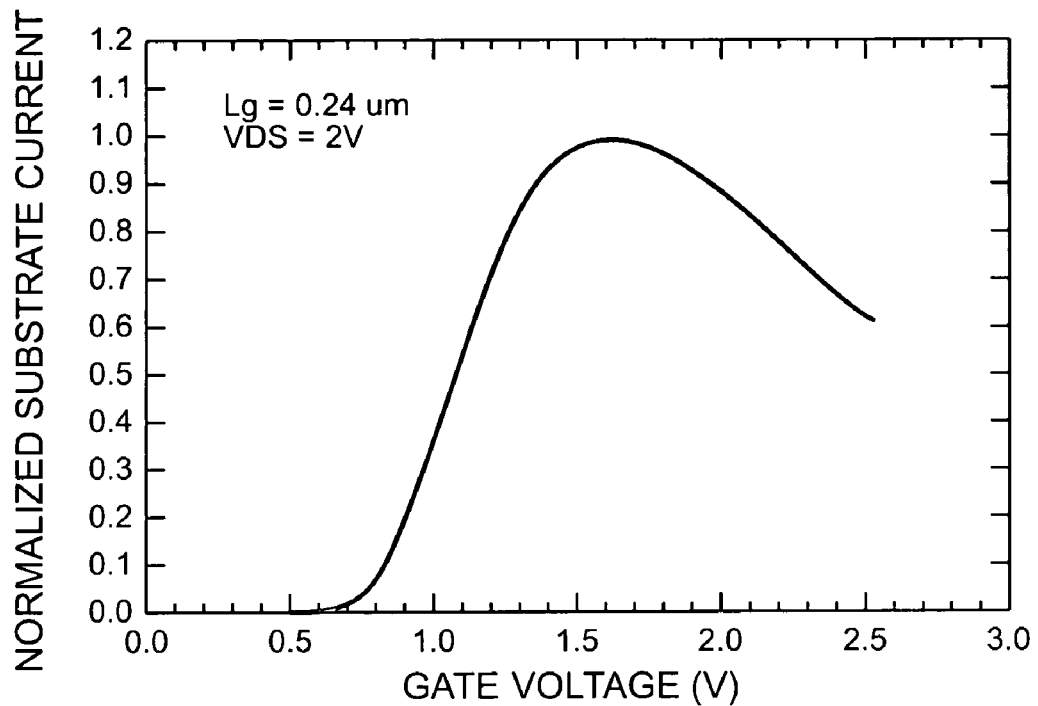
FIG._5
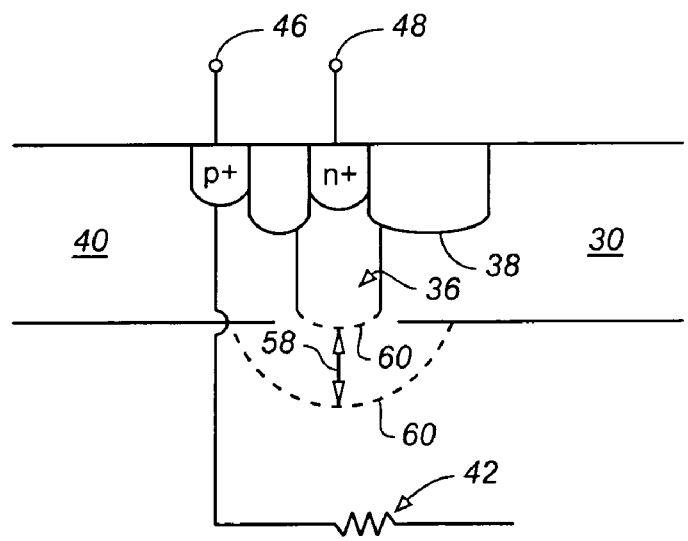
FIG._6

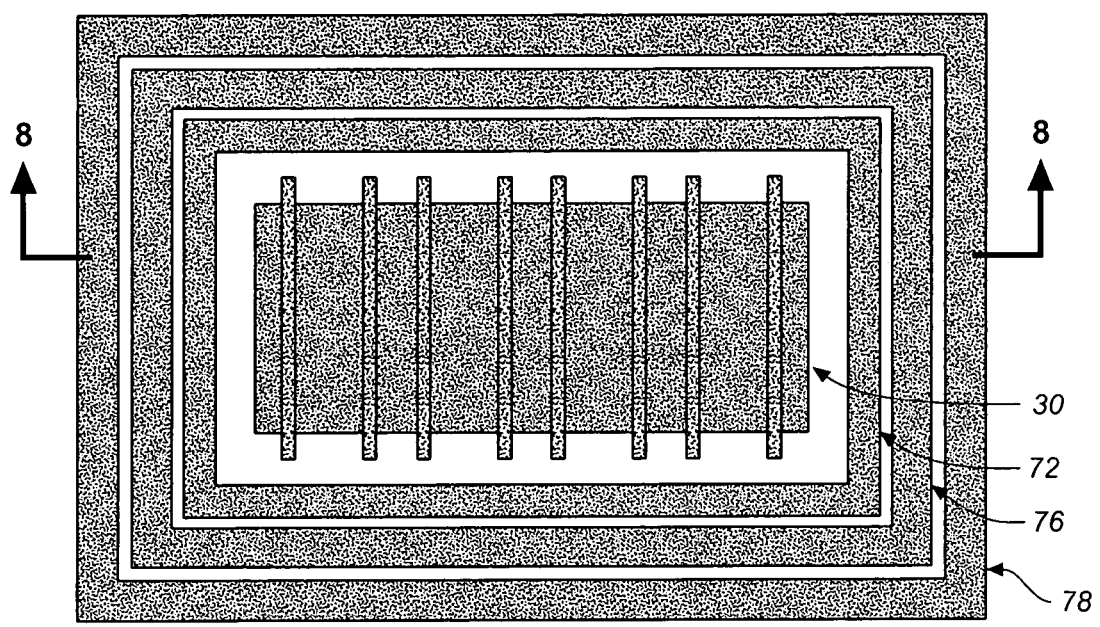
FIG._7

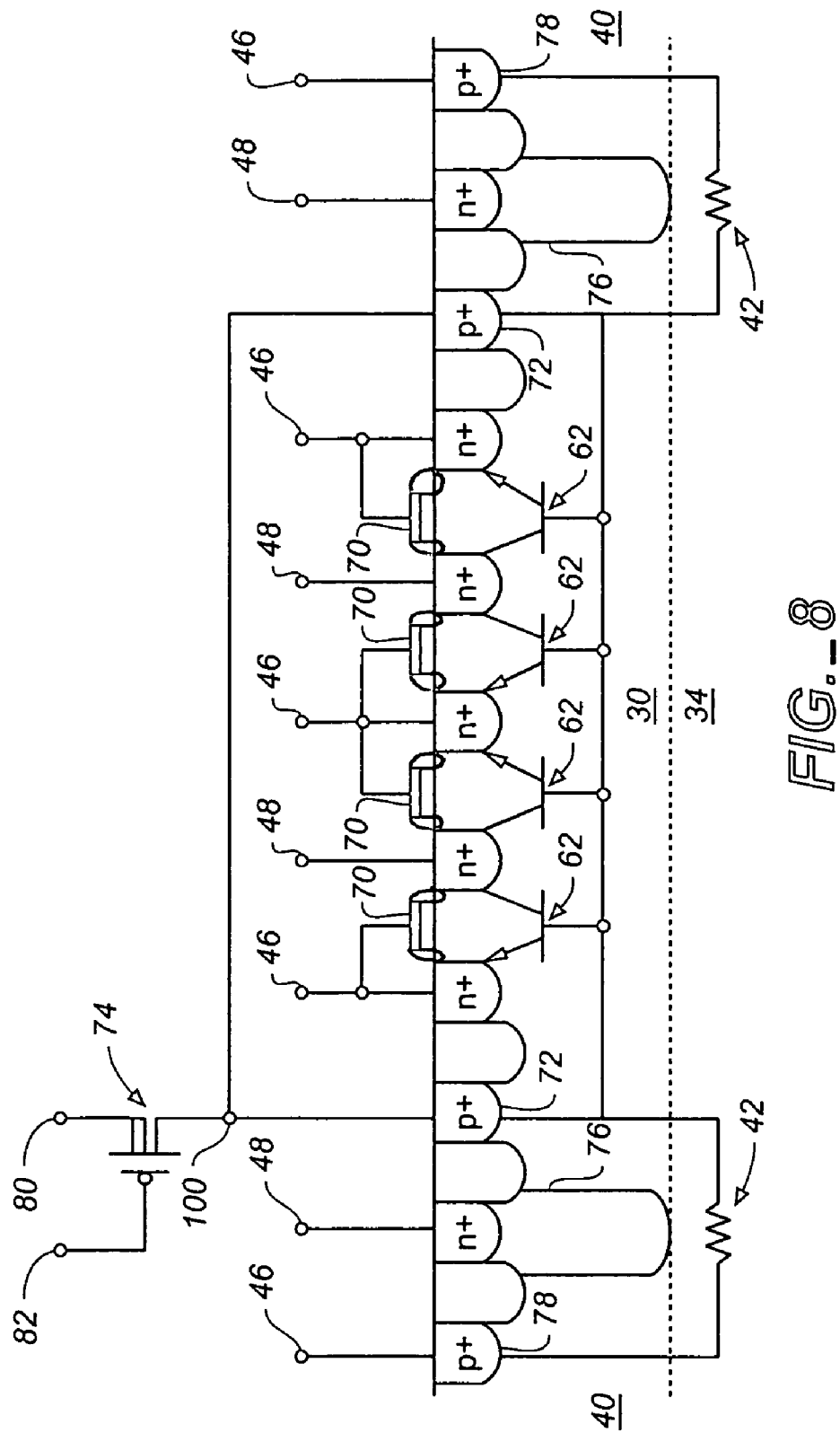
FIG._8

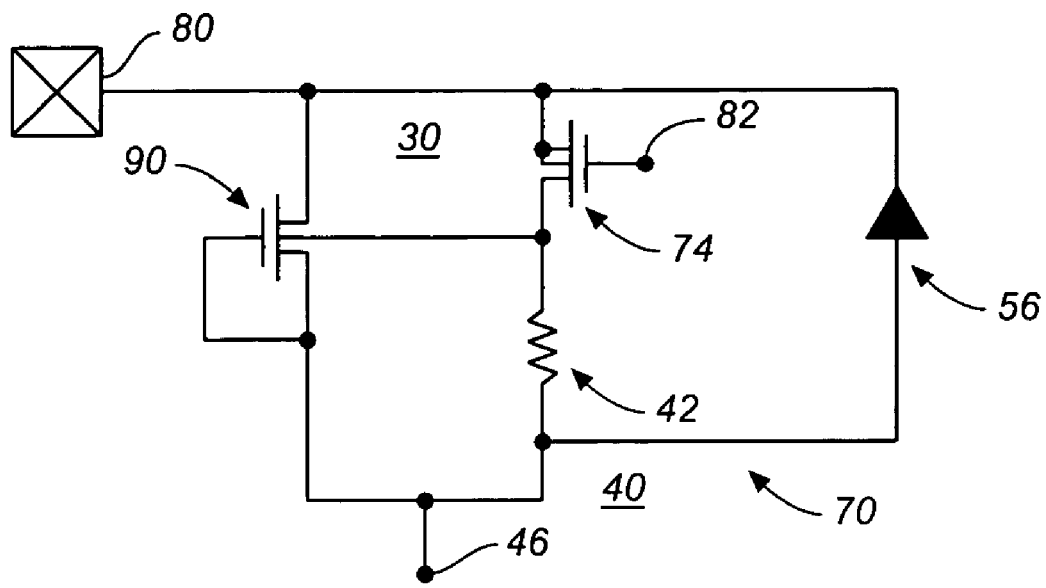
FIG._9
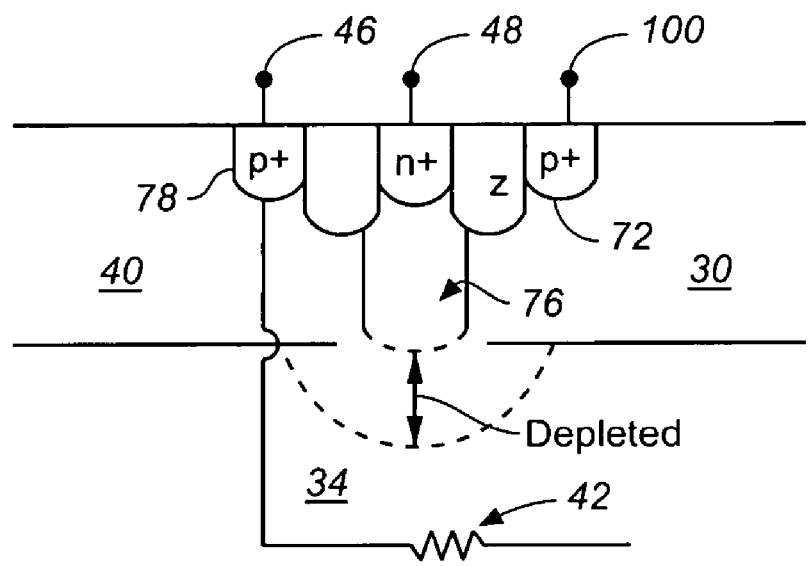
FIG._10

SUBSTRATE-BIASED I/O AND POWER ESD PROTECTION CIRCUITS IN DEEP-SUBMICRON TWIN-WELL PROCESS

BACKGROUND

The present invention generally relates to ESD (Electro-Static Discharge) protection devices in integrated-circuit chip designs, and more specifically relates to low-voltage trigger NMOS fingers.

Grounded-gate NMOSFET's (ggNMOSFET's) are widely used as the power pin ESD (Electro-Static Discharge) protection device in integrated-circuit chip designs. A cross-sectional diagram of a typical four-finger ggNMOSFET is shown in FIG. 1, wherein reference numerals 10 identify the fingers. The ggNMOSFET is triggered by turning-on parasitic bipolar transistors 24 due to avalanche breakdown with the generation of electron-hole pairs. In FIG. 1, reference numerals 14 identify VSSIO interconnects, reference numerals 16 identify VDD interconnects, and reference numerals 18 identify shallow trench isolation ("STI") regions.

The P-well 20 is formed on a P-conductivity type substrate 22. To trigger the parasitic bipolar transistors 24, the effective P-Well resistance 26 plays an important role because of building-up the potential at the source to P-Well junction 28. However, the doping concentration of the P-well 20 is usually much higher than that of the resistance of the P-substrate 22, so the effective P-Well resistance 26 is relatively low. As CMOS technology scales down in the semiconductor industry, gate-oxide thickness decreases (e.g., 20 Angstroms in 0.13 $\mu$m node technology), as well as junction depth. Therefore, the ESD design window is narrowed because the triggering voltage of ggNMOSFET's is very close to the voltage level at which the oxide breaks down. It becomes especially difficult to protect ESD protection devices in power-crossing circuitry, e.g., in digital-to-analog or analog-to-digital interface circuits. To lower the triggering voltage of ggNMOSFET's, U.S. Pat. No. 6,469,354 proposes providing a high impedance region between ggNMOSFET's and VSS P-well taps to trigger the parasitic bipolar transistors below avalanche breakdown due to the high resistance of the P-substrate. However, this approach cannot be a universal solution in CMOS technology because, unless an additional P/N junction diode is provided, ESD protection degrades in the case of negative zapping, due to the high-impedance region. Additionally, triggering voltage cannot be lowered too substantially in the case of high avalanche breakdown junction design.

In C. Duvvury & A. Amerasekera, *Advanced CMOS Protection Device Trigger Mechanisms During CDM*, 1995 EOS/ESD Symposium (EOS-17), pp. 162–174, gate-coupled NMOS fingers were designed to lower the triggering voltage by using an external capacitor and an external resistor. However, this gate-coupled device usually needs a large layout area, and thus is not feasible.

OBJECTS AND SUMMARY

An object of an embodiment of the present invention is to provide low-voltage trigger NMOS fingers by introducing both a gate-coupled effect and a high substrate resistance as the ESD power clamp device.

Another object of an embodiment of the present invention is to provide a gate-coupled effect by using only a simple N-Well resistor, and using a high substrate resistance to enhance the trigger when the gate is coupled.

Still another object of an embodiment of the present invention is to lower the triggering voltage without degrading ESD protection in negative zapping direction.

Still yet another object of an embodiment of the present invention is to provide an ESD protection device which is configured such that avalanche breakdown is not the main trigger mechanism.

Briefly, and in accordance with at least one of the foregoing objects, an embodiment of the present invention provides a semiconductor device which includes a P-well which is underneath NMOS fingers. The device includes an N-well ring which is configured so that the inner P-well underneath the NMOS fingers is separated from an outer P-well. The inner P-well and outer P-well are connected by a P-substrate resistance which is much higher than the resistance of the P-wells. A P+-diffusion ring surrounding the N-well ring is configured to connect to VSS, i.e., P-taps.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIG. 1 provides a cross-sectional diagram of a typical four-finger ggNMOSFET;

FIG. 2 provides a top view of an nMOSFET design layout for power ESD protection which is in accordance with an embodiment of the present invention;

FIG. 3 provides a side, cross-sectional view of the design shown in FIG. 2, taken along line 3—3 of FIG. 2;

FIG. 4 provides an exemplary schematic circuit diagram of one of the NMOS fingers shown in FIGS. 2 and 3;

FIG. 5 is a graph which shows gate-voltage dependance of normalized substrate current in 0.13 $\mu$m node technology;

FIG. 6 shows a biased N-well ring to separate P-well regions, which suppresses the substrate current flowing into the VSS P-taps;

FIGS. 7–10 are similar to FIGS. 2, 3, 4 and 6, but relate to an nMOSFET design layout for I/O ESD protection which is in accordance with another embodiment of the present invention.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

Power ESD Protection Circuit

FIGS. 2 and 3 provide a top-view and a cross-sectional view, respectively, of an nMOSFET design layout which is in accordance with an embodiment of the present invention. A P-well 30 is underneath NMOS fingers 32 and is formed on a P-conductivity type substrate 34. The P-well 30 is surrounded by an N-well ring (VDD) 36. A lightly-doped P-type region 34 having an impurity concentration lower than that of the P-well 30 is provided as underlying a field oxide film. The N-well ring 36 is designed so that the inner P-well 30 underneath the NMOS fingers 32 is separated from the outer P-well 40. The inner P-well 30 and outer P-well 40 are connected by a P-substrate resistance 42 which is much higher than the resistance of the P-wells 30, 40. A P+-diffusion ring 44 surrounding the N-well ring 36 is configured to connect to VSS, i.e., P-taps. In FIG. 3, reference numerals 46 identify VSSIO interconnects, and reference numerals 48 identify VDD interconnects.

A schematic circuit diagram of one of the NMOS fingers 32 is shown in FIG. 4. As shown, a high-value N-well resistor 50 is disposed between the gates 52 and VSS 46. Reference numeral 30 in FIG. 4 identifies the P-well which is underneath the NMOS fingers 32, reference numeral 40 identifies the outer P-well, reference numeral 42 identifies the substrate resistance and reference numeral 56 identifies a N-well diode. In the positive ESD zapping, VDD pad voltage is increased. The gate nodes act as a high-pass filter because of drain-to-gate capacitance and the external N-well resistance, and thus will be coupled. After the gate is coupled, the substrate current of the NMOS fingers 32 increases. FIG. 5 shows the normalized DC substrate current in 0.13 $\mu$m node technology. In FIG. 5, gate voltage is provided along the horizontal axis, and the normalized substrate current is provided along the vertical axis (Lg=0.24 $\mu$m, VDS=2 volts). Since the NMOS P-well 30 is separated by the N-well ring 36, the substrate current flows into the high-resistance P-substrate 34. Furthermore, because the N-well ring 36 is connected to VDD, it suppresses (as identified by line 58 and arcs 60 in FIG. 6) the substrate current flowing to the VSS P-taps (i.e., the outer P-well 40) due to extension of P-substrate depletion, i.e., increasing the effective substrate resistance 42. Thus, the NMOS P-well voltage is built-up, and triggers the parasitic bipolar transistors 62 (see FIG. 3) at low voltage.

Since the gate-coupled effect strongly depends on drain-to-gate capacitance and external N-well resistance, the value of the N-well resistor 50 must be well optimized. Preferably, the value of the resistor 50 is provided at between 15 kiloOhm–20 kiloOhm for 300 um–500 um NMOS fingers.

In the negative ESD zapping, since the N-well is deeper than STI (Shallow-Trench Isolation), the ESD current can flow from P-taps (i.e., VSS) to VDD pad using the P-Well/N-Well junction diode (identified with reference numeral 56 in FIG. 4). Therefore, the N-well ring 36 also provides a negative ESD path to avoid the ESD current flowing through the high-resistance P-substrate region (also see FIG. 6).

By introducing both gate-couple and high-resistance substrate effects, the NMOS fingers 32 have very low trigger voltages. To minimize the layout area, the gate-couple effect is achieved by using a simple N-well resistor 50 with high resistance. The N-well ring 36 is configured to separate the inner P-Well 30 and the outer P-Well 40, where the inner P-well 30 is the P-well underneath the NMOS fingers 32 and the outer P-well 40 is the P-well connected to VSS. Because the N-well ring 36 is connected to VDD pad, the N-well ring 36 suppresses the injected current flowing into the outer P-well 40 by increasing the depletion depth in the P-substrate region (see FIG. 6). The N-well ring 36 also provides a low-impedance ESD path in the negative ESD zapping from the outer P-well 40 to this N-well ring 36.

I/O ESD Protection Circuit

FIGS. 7–10 are similar to FIGS. 2, 3, 4 and 6, respectively, so like reference numerals are used to represent like parts (i.e., 30, 34, 40, 42, 46, 48, 56, 62), and a detailed description is omitted. However, the differences between the Figures will become apparent from the following description. FIGS. 7 and 8 provide a top-view and a cross-sectional view, respectively, of an nMOSFET design layout which is in accordance with another embodiment of the present invention. In FIGS. 7 and 8, a P-well 30 is underneath grounded-gate NMOS fingers 70 and is surrounded by one P+diffusion ring 72 which is connected to one small-size pMOSFET 74 as the trigger node. An N-well ring 76 surrounds this triggering P+-diffusion ring 72 so that the inner P-well 30 underneath the ggNMOSFET's is separated from the outer P-well 40. The inner P-well 30 and outer P-well 40 are connected by P-substrate resistance 42 which is much higher than the resistance of the P-wells. Finally, a P+-diffusion ring 78 surrounds the N-well 76 and ties to VSS, i.e., P-taps. For small-size pMOSFE.T's, preferably a long channel length is used (i.e., greater than or equal to 0.5 $\mu$m, and its drain and N-well is tied to I/O pads 80, its source is connected to the triggering P+-diffusion 72, and its gate is connected to VDDIO 82. A schematic circuit diagram of one of the NMOS fingers 70 is shown in FIG. 9.

In the positive ESD zapping, I/O pad voltage is increased. The gate voltage of PMOSFET's is either the same as VSSIO for the fail-safe case, or lower than I/O pad voltage at least one P/N diode voltage drop for the PMOS driver which N-well is connected to VDDIO. Thus, the PMOSFET is turned on and injects current into the triggering P+-diffusion node. When the injected current is very small, it will just flow to P-taps (i.e., VSSIO) through the P-substrate region underneath the N-well, and thus builds up voltage at the triggering P+-diffusion node. Because of high substrate resistance 42, the voltage drop at this node increases very easily. When the injected current becomes sufficiently high so that the voltage drop between the triggering P+diffusion node and VSSIO is higher than the turn-on voltage of the forward junction diode (~0.7V), the injected current begins to flow into the sources of ggNMOSFET's as base current of the bipolar transistors 62. Hence, the ggNMOSFET's are triggered. Besides the injected current, the drains of ggNMOSFET's contribute a small amount of hole current due to weak impact ionization.

For the N-Well ring, because it is connected to I/O pad, the depletion region in the P-substrate will extend deeper when the I/O pad voltage increases. As shown in FIG. 10, the extended depletion region results in the injected current flowing deeper in the P-substrate region 34, and thus increases the effective substrate resistance. Therefore, in the positive ESD zapping, the N-Well ring plays a role in suppressing the injected current flowing into P-taps (i.e., VSSIO), and thus enhances the current flowing to the sources of ggNMOSFET's (see FIG. 10, noting that node 100 is identified in both FIGS. 8 and 10).

In the negative ESD zapping, since the N-well is deeper than STI (Shallow-Trench Isolation), the ESD current can flow from P-taps (i.e., VSSIO) to I/O pad using the P-well/N-well junction diode. Therefore, the N-Well ring 76 also provides a negative ESD path to avoid the ESD current flowing through the high-resistance P-substrate region 34.

A small-size and long channel-length PMOSFET is designed to inject the triggering current. Thus, the ggNMOSFET's (ESD device) (see reference numeral 90 in FIG. 9) are triggered mainly due to the injected current, not the avalanche breakdown mechanism. The size and channel length of PMOSFET is suggested to be around 20 $\mu$m and 0.5 $\mu$m, respectively. The N-well ring 76 is configured to separate the inner P-well 30 and the outer P-well 40, where the inner P-well 30 is the P-well underneath the ggNMOSFET's and the outer P-well 40 is the P-Well connected to VSSIO. Because the N-well ring 76 is connected to I/O pad 48, the N-well ring 76 suppresses the injected current flowing into the outer P-well 40 by increasing the depletion depth in the P-substrate region 34 (see FIG. 10).

The N-well ring 76 also provides a low-impedance ESD path in the negative ESD zapping from the outer P-well 40 to this N-well ring 76. The triggering P+-diffusion ring 72 sinks the injection current from the PMOSFET. Preferably, the ring is as narrow as possible.

While embodiments of the present invention are shown and described, it is envisioned that those skilled in the art may devise various modifications of the present invention without departing from the spirit and scope of the appended claims.

What is claimed is:

1. A semiconductor device comprising:
a semiconductor substrate;
a first well region formed on a surface region of said semiconductor substrate, said first well region having therein at least one MOS transistor and having at least one NMOS finger thereon;
a second well region formed on a surface region of said semiconductor substrate; and
a well ring formed on a surface region of said semiconductor substrate and disposed between said first well region and said second well region, said well ring configured such that said first well region is separated from said second well region other than through a resistance of the semiconductor substrate, wherein the NMOS finger comprises a pMOSFET having its drain tied to an I/O pad, its source connected to a diffusion ring, and its gate is connected to VDDIO.

2. The semiconductor device as recited in claim 1, wherein the NMOS finger provides that a resistor is disposed between a gate and VSS.

3. The semiconductor device as recited in claim 2, wherein the gate is configured to act as a high-pass filter.

4. The semiconductor device as recited in claim 1, wherein the well ring is connected to VDD.

5. The semiconductor device as recited in claim 1, wherein the NMOS finger provides that a resistor is disposed between a gate and VSS, wherein the gate is configured to act as a high-pass filter, and wherein the well ring is connected to VDD.

6. The semiconductor device as recited in claim 1, wherein the diffusion ring is disposed between the well ring and the first well region.

7. The semiconductor device as recited in claim 6, wherein the diffusion ring is connected to a pMOSFET which is configured to function as a trigger node.

8. The semiconductor device as recited in claim 6, wherein the well ring surrounds the diffusion ring.

9. The semiconductor device as recited in claim 8, wherein the diffusion ring is connected to VSS.

10. The semiconductor device as recited in claim 1, wherein the diffusion ring is disposed between the well ring and the first well region, wherein the diffusion ring is connected to a pMOSFET which is configured to function as a trigger node, and wherein the well ring surrounds the diffusion ring.

11. The semiconductor device as recited in claim 10, wherein the diffusion ring is connected to VSS.

12. A semiconductor device comprising:
a semiconductor substrate;
a first well region formed on a surface region of said semiconductor substrate, said first well region having therein at least one MOS transistor and having at least one NMOS finger thereon, wherein the NMOS finger provides that a resistor is disposed between a gate and VSS; and
a second well region formed on a surface region of said semiconductor substrate, wherein the NMOS finger comprises a pMOSFET having its drain tied to an I/O pad, its source connected to a diffusion ring, and its gate is connected to VDDIO.

13. The semiconductor device as recited in claim 12, wherein the gate is configured to act as a high-pass filter.

14. The semiconductor device as recited in claim 12, wherein the NMOS finger provides that a resistor is disposed between a gate and VSS, wherein the gate is configured to act as a high-pass filter, and wherein a well ring is connected to VDD.

15. The semiconductor device as recited in claim 12, further comprising a well ring, wherein the diffusion ring is disposed between the well ring and the first well region.

16. The semiconductor device as recited in claim 15, wherein the diffusion ring is connected to a pMOSFET which is configured to function as a trigger node.

17. The semiconductor device as recited in claim 15, wherein the well ring surrounds the diffusion ring.

18. The semiconductor device as recited in claim 17, wherein the diffusion ring is connected to VSS.

* * * * *